United States Patent [19]

Kitano et al.

[11] Patent Number: 5,047,837
[45] Date of Patent: Sep. 10, 1991

[54] SEMICONDUCTOR DEVICE WITH HEAT TRANSFER CAP

[75] Inventors: Makoto Kitano, Niihari; Takahiro Daikoku, Ushiku; Sueo Kawai, Nishiibaraki; Ichio Shimizu, Sawa; Kazuo Yamazaki, Isesaki; Asao Nishimura, Ushiku; Hideo Miura; Akihiro Yaguchi, both of Niihari, all of Japan

[73] Assignee: Hitachi, Ltd., Tokyo, Japan

[21] Appl. No.: 388,943

[22] Filed: Aug. 3, 1989

[30] Foreign Application Priority Data

Aug. 15, 1988 [JP] Japan .................. 63-201844

[51] Int. Cl.⁵ .................................. H01L 23/02
[52] U.S. Cl. ........................ 357/81; 357/70; 364/388
[58] Field of Search ............ 357/72, 81, 70; 364/381, 388, 389

[56] References Cited

U.S. PATENT DOCUMENTS

| | | | |
|---|---|---|---|
| 3,786,317 | 1/1974 | Thierfelder | 317/234 |
| 4,209,798 | 6/1980 | Beretta | 357/70 |
| 4,561,006 | 12/1985 | Carrie | 357/28 |
| 4,926,242 | 5/1990 | Itoh et al. | 357/81 |

FOREIGN PATENT DOCUMENTS

| | | | |
|---|---|---|---|
| 3203609 | 8/1983 | Fed. Rep. of Germany | 357/81 |
| 55-128853 | 10/1980 | Japan | 357/81 |
| 60-138944 | 7/1985 | Japan | 357/81 |
| 62-150865 | 7/1987 | Japan | 357/81 |
| 1361566 | 7/1974 | United Kingdom | 357/81 |

Primary Examiner—Jerome Jackson, Jr.
Assistant Examiner—D. Monin
Attorney, Agent, or Firm—Antonelli, Terry, Stout & Kraus

[57] ABSTRACT

A packaged semiconductor device having heat transfer leads carrying a semiconductor chip directly or indirectly through a chip pad and extended to the exterior of the plastic or ceramics seal of the package, and a heat transfer cap held in surface contact with the extended heat transfer leads and covering upper side of the package. The heat generated in the semiconductor chip is transmitted to the upper side of the package and to the printed circuit board only through metallic parts so that the heat transfer is enhanced to remarkably reduce thermal resistance, thus enabling packaging of a semiconductor chip having a large heat generation rate.

4 Claims, 7 Drawing Sheets

SEMICONDUCTOR DEVICE WITH HEAT TRANSFER CAP

BACKGROUND OF THE INVENTION

1. Field of the Invention

The present invention relates to an improved semiconductor packaging structure and, more particularly, to a packaged semiconductor device which has superior heat transfer characteristic.

2. Prior Art

Various structures have been developed and proposed for reducing heat resistance of semiconductor devices, with a most effective being a structure in which heat generated at the chip is diffused to the exterior of the package only through metals, i.e., without any resin or other insulating material which has small thermal conductivity. Such a semiconductor package structure is disclosed, for example, in Japanese Patent Unexamined Publication Nos. 55-72065, 58-100447, 59-28364, 61-53752 and 62-123748.

In the structures shown in Japanese Patent Unexamined Publication Nos. 55-72065, 58-100447 and 59-28364, the semiconductor element directly contacts heat transfer fins. This type of structure is rather difficult to fabricate in ordinary IC packaging process, though it exhibits superior heat transfer effect. In addition, this type of structure tends to allow water to enter the package along the interface between the metallic part and plastic part of the package, causing a risk for the electrode of the chip to be corroded.

The structures disclosed in Japanese Patent Unexamined Publication Nos. 61-53752 and 62-123748 are easy to manufacture by ordinary IC fabrication process and are free from problems of corrosion of the semiconductor elements. These structures, however, cannot provide sufficient heat transfer effect particularly when, adopted to current large-sized and densely arranged chips which produce large amount of heat.

Structures also have been proposed in which heat is diffused through a seal such as of a plastic or a ceramic. Such structures, however, are inferior in heat transfer characteristic.

SUMMARY OF THE INVENTION

Accordingly, an object of the present invention is to provide a semiconductor package structure capable of packaging semiconductor chips which produce a large amount of heat.

The above-described object can be achieved by a semiconductor device in which a chip pad on which a semiconductor chip is attached is extended to the exterior of the package and the thus extended portion (referred to as chip pad extension, hereinafter) is connected to a printed circuit board, wherein a heat transfer cap is connected to the chip pad extension so as to cover the upper side of the package or the chip pad extension is further extended to the upper side of the package.

According to the invention, a semiconductor device comprises a semiconductor chip attached on a chip pad with a plurality of conductor leads being spaced from the chip pad being electrically connected to an upper side of the semi-conductor chip; a sealing portion, made of plastic or ceramics, seals and packages the semiconductor chip, the chip pad, a portion of the conductor leads and the wires; and the chip pad is extended from both lateral sides of the sealed package; with a heat transfer cap covering at least a portion of the package and making surface contact with the extensions of the chip pad.

The extensions of the chip pad may be are extended from a plurality of portions of each lateral side of the sealed package, and a heat transfer cap may cover at least a portion of the package and makes surface contact with the extensions of the chip pad, in such a manner that the distances between the surface contact regions of the extensions of the chip pad and the semiconductor chip are substantially equal.

The extensions of the chip pad extended from the lateral side of the sealed package may have a width greater than that of each conductor lead, and a heat radiation cap may cover at least a portion of the package while making surface contact with the extensions of the chip pad.

According to another aspect of the invention, the leads may be led from at least a pair of opposing sides of the sealed package, with the chip pad having extensions extended for connection to a printed circuit board from both of at least the pair of opposing sides of the sealed package from which said leads are led. A metallic cap may held in contact with both of the extensions of the chip pad and shaped to cover at least a portion of the surface of the sealed package opposite to the surface facing the printed circuit board.

According to still another aspect of the invention, the chip pads having extensions extended for connection to a printed circuit board from the surface of the package from which the leads are led, with the extensions of the chip pad being projected beyond a plane parallel to the printed circuit board past points in the surface of the package opposite to the surface facing the printed circuit board which are remotest from the printed circuit board, and the projected ends of the extensions of the chip pad are bent and connected to the printed circuit board.

Although some aspects and forms of the invention stated above employ chip pads for heat transmission member, the use of such chip pads are not essential. Namely, the invention can be carried out without using any chip pad, by arranging such that suitable portions of the leads attach the semiconductor chip.

According to the invention, a metallic cap for use in a semiconductor device of the type comprises a semiconductor package including a semiconductor chip, on a chip pad leads, and a seal portion made of plastic or ceramic so as to seal and package the semiconductor chip, the chip pad and the leads. The leads are led from at least a pair of opposing sides of the sealed package, and the chip pad has extensions extended from both of at least a pair of opposing sides of the sealed package for connection to a printed circuit board. The metallic is held in contact with both of the extensions of the chip pad and shaped to cover at least a portion of the surface of the sealed package opposite to the surface facing the printed circuit board.

Such a cap is preferably provided with heat transfer fins. The heat transfer cap may be made also from a non-metallic material provided that such a nonmetallic material provided a high heat transfer effects.

Preferably, the heat transfer cap has a tabular portion disposed above the top surface of the package and leg portions bent from the tabular portion into the surface contact with the extensions of the chip pad. In a specific form of the present invention, the lower ends of the heat transfer cap makes a press-fit on the surface contact with the chip pad extensions by resiliency. Such an arrangement enables the heat transfer cap to be detachably mounted on the chip pad extensions. This, however, is not exclusive and the heat transfer cap may be fixed to the chip pad extensions by soldering or by means of an adhesive, provided that such fixing does not impair transmission of heat. Other fixing methods such as welding, diffusion bonding and even spring-forced fit are also usable.

The tabular portion of the heat transfer cap covering the package may be spaced from or held in contact with the top surface of the package.

The chip pad and leads are spaced from each other for electrical insulation.

When the semiconductor device is a plastic modulated type, the chip pad, semiconductor chip, wire and a portions of the lead (generally referred to as "inner lead") are molded in plastic.

When the semiconductor device is of a ceramics sealed type, these major components of the device are encased in a sealing ceramic case which is composed of upper and lower halves which are brought together to complete the case with the major components of the semiconductor device held therein.

In a preferred method of mounting the heat transfer cap, the cap is set on the chip pad extensions with solder layers interposed therebetween, the solder layer being molten by the heat applied during mounting of the package on the printed circuit board so as to fix the heat transfer cap to the chip pad extensions.

When a solder is used for fixing the heat transfer cap to the chip pad extensions, the solder preferably has a melting point higher than that of the solder with which the package is fixed to the printed circuit board. The cap and the chip pad extensions may be provided with mating projections and recesses to enable them to be located with respect to each other.

It is effective to connect portions of the chip pad extensions on the package surface and the portions of the same which extend from positions remotest from the printed circuit board towards the printed circuit board.

When fabricating the semiconductor device of the present invention, the size, shape and the material of the heat transfer cap are preferably determined on the basis of the operating conditions and the allowable temperature of the semiconductor chip of the device.

In the semiconductor device of the present invention, the heat transfer cap is held in contact with the chip pad extensions or loads for heat transfer and the heat transfer cap is allowed to have a large area, so as to decrease the thermal resistance at the boundary between the heat transfer cap and the ambient air.

The heat transfer performance is remarkably improved when the surface contact between the heat transfer cap and the chip pad extensions is made at a plurality of positions, in particular when these plurality of positions are spaced by the same distance from the semiconductor chip. Namely, the chip pad and the chip pad extensions have a thickness substantially the same as those of the leads, e.g., 0.15 to 0.25 mm, so that heat transmitted through the chip pad and the chip pad extensions encounters with considerably large resistance. If the heat transfer cap is connected to the chip pad only at one side of the package, the cooling effect is produced only to such one side of the package while the other side is not cooled efficiently.

According to some forms of the present invention, a metal plate carrying the semiconductor chip is directly connected to the printed circuit board without any intermediary of plastic or other material having large heat resistance, or the metal plate is directly connected to a heat transfer cap disposed above the package without any intermediary of plastic or other material having large heat resistance. Thus, in the package of the present invention, the heat generated at the semiconductor chip can be dissipated only through the metallic parts which have high thermal conductivity, thereby maximizing the heat transfer efficiency.

According to the present invention, the heat generated at the semiconductor chip is directly dissipated to the ambient air so that the heat resistance can be reduced remarkably as compared with known semiconductor packages. This in turn enables packaging of semiconductor chips having a large heat generating rate.

The semiconductor device of the present invention, which exhibits superior heat transfer performance, can be produced without requiring any substantial change or modification of the known production process. In addition, the semiconductor device of the present invention is free from the problem of corrosion of the electrode of the semiconductor chip. Thus, the present invention offers a great advantage both in the productivity and reliability.

According to the present invention, the heat generated at the semiconductor chip is directly dissipated to the ambient air from the upper side of the package so that the heat resistance can be reduced remarkably as compared with known semiconductor packages.

The present invention enables a semiconductor device to be packaged in various forms, simply by selecting the size, shape and material of the heat transfer cap. This advantageously permits common use and standardization of the semiconductor device and the printed circuit board.

DESCRIPTION OF THE PREFERRED EMBODIMENTS

Figure 1:
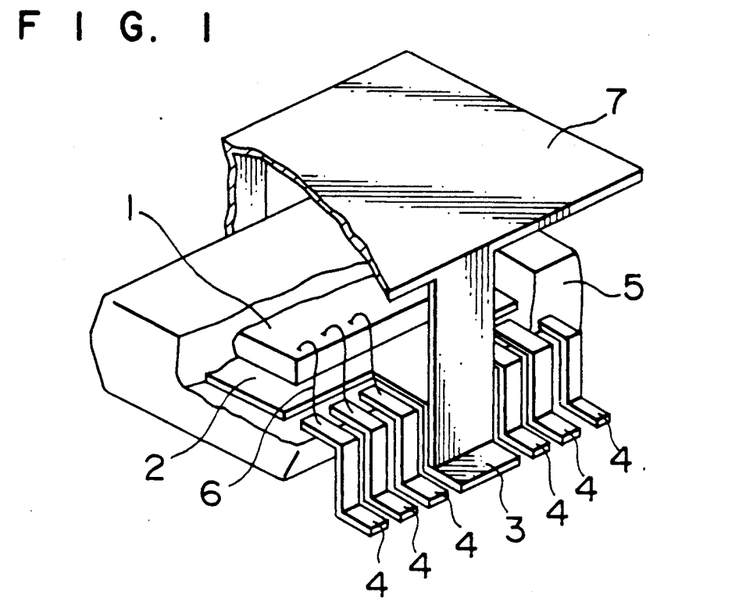
FIG. 1 is a perspective view of a first embodiment of the semiconductor device of the present invention.
Figure 2:
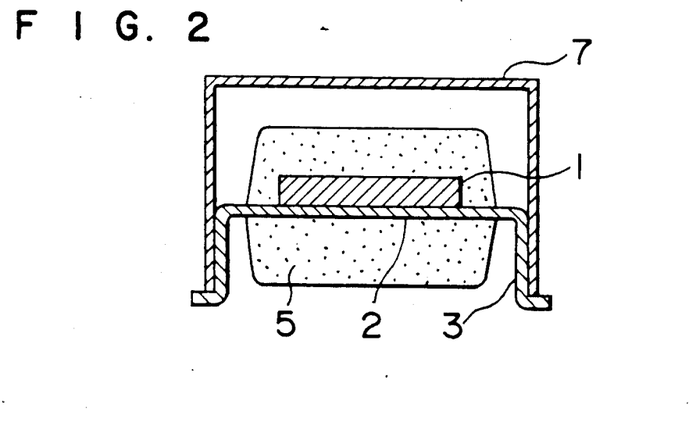
FIG. 2 is a sectional view of the semiconductor device of FIG. 1.

FIGS. 1 and 2 show a first embodiment of the semiconductor device in accordance with the present invention, with a portion of the plastic part thereof being removed to show the internal structure of the IC package. A semiconductor chip or element 1 is mounted on a chip pad 2. Usually, the chip pad 2 is formed by punching together with conductor leads 4 from a single sheet material. The chip pad 2 therefore has a small thickness of 0.15 to 0.25 mm, similarly the conductor leads 4.

The chip pad 2 has extensions which may serve also as so-called chip pad suspension lead. In this embodiment, the chip pad extensions provide a heat transfer leads 3. The heat transfer leads 3 contribute only to heat transfer and, therefore, is electrically insulated from conductor leads 4. Thus, the heat transfer leads 3 do not have any function for electrical conduction. The heat transfer leads 3 extend from both lateral sides of the chip pad 2 and are co-planar with the conductor leads 4 which are electrically connected to upper side of the semiconductor chip 1 through wires 6. The semiconductor device is sealed with a suitable sealing material which is plastic in this embodiment, so that the semiconductor device of this embodiment is constructed as an IC package.

The semiconductor device of this embodiment has a heat transfer cap 7 which is connected to both heat transfer leads 3 extended, from both lateral sides of the chip pad 2. As will be seen from FIG. 2 which is a sectional view of the semiconductor device of FIG. 1 taken along a plane including both heat transfer leads 3, the heat transfer cap 7 is mounted such that a gap is formed between itself and the upper surface of the package and has a tabular form which is wide enough to cover the entire area of the top surface of the package. The heat transfer cap 7 has a pair of legs extending downward from both edges of the tabular portion thereof. The distance between these legs is slightly smaller than the width of the tabular portion. In the illustrated embodiment, the distance between these legs is substantially the same as the distance between two heat transfer leads 3. Thus, the legs of the heat transfer cap 7 closely fit on the outer surfaces of the heat transfer leads 3. The heat transfer leads 3, as well as the conductor leads 4, are bent at their lower ends so as to extend outwardly so that they can be surface-mounted to a printed circuit board.

In this embodiment, the heat generated at the semiconductor chip 1 is transferred only through metallic parts so that the heat transfer is enhanced to remarkably reduce the heat resistance of the IC package. The connection between the heat transfer leads 3 and the heat transfer cap 7 can be conducted by, for example, soldering, adhesive, screws, rivets or welding. When the connection between the heat transfer leads 3 and the heat transfer cap 7 is achieved by soldering, the solder used for this purpose should have a melting point higher than that of the solder which is used in fixing the conductor leads 4 to the printed circuit board, so that undesirable flowing of solder between the heat transfer leads 3 and the heat transfer cap 7 is prevented during soldering of the conductor leads 4, thus eliminating any risk for the heat transfer cap 7 to be displaced.

Figure 3:
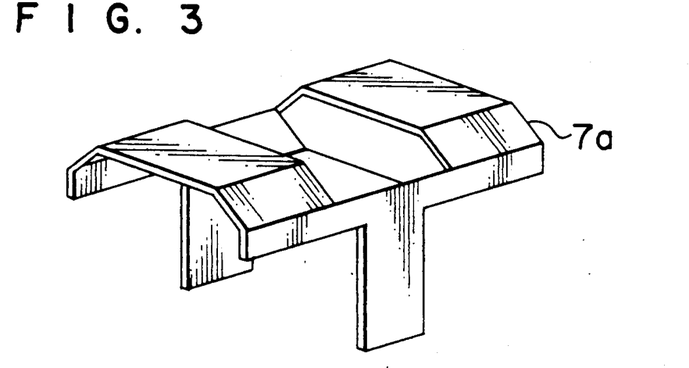
FIG. 3 is a perspective view of a heat transfer cap used in a second embodiment of the present invention.

The construction of the semiconductor package of FIG. 3 is the same as that of the first embodiment; however, the heat transfer cap is cut and deformed as illustrated so as to provide convexities which function as heat transfer fins.

Figure 4:
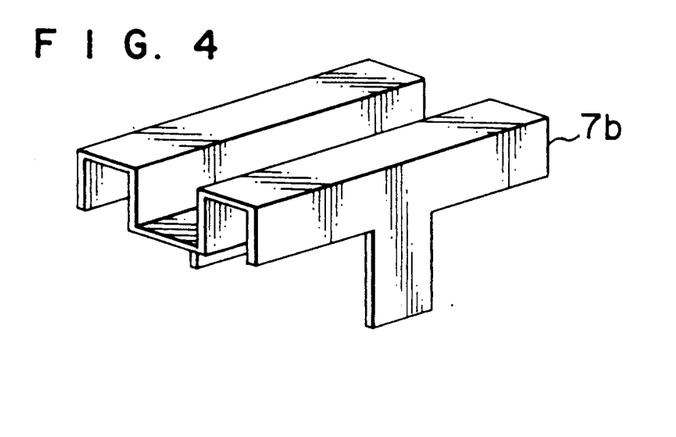
FIG. 4 is a perspective view of a heat transfer cap used in a third embodiment of the present invention.
Figure 5:
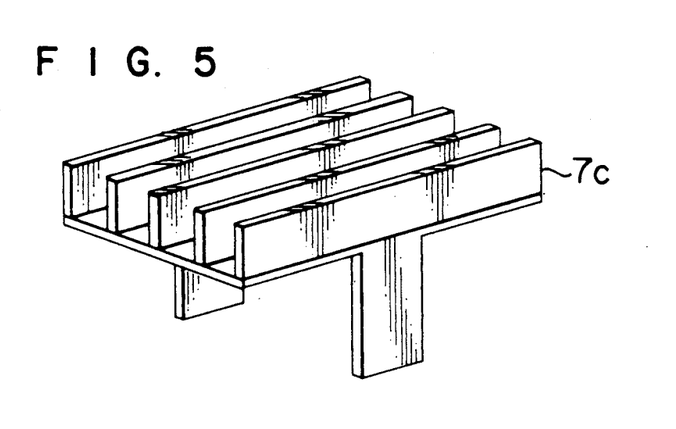
FIG. 5 is a perspective view of a heat transfer cap used in a fourth embodiment of the present invention.

The semiconductor package of FIG. 4 has a construction materially the same as that of the first embodiment; however, the cap 7b is undulated so as to have ridges and valleys as illustrated to provide a greater heat transfer surface area thereby enhancing heat transfer effect. The construction of the semiconductor package of FIG. 5 is substantially the same as that used in the first embodiment; however, the heat transfer cap 7c is provided with fins so as to provide a greater heat transfer effect.

Figure 6:
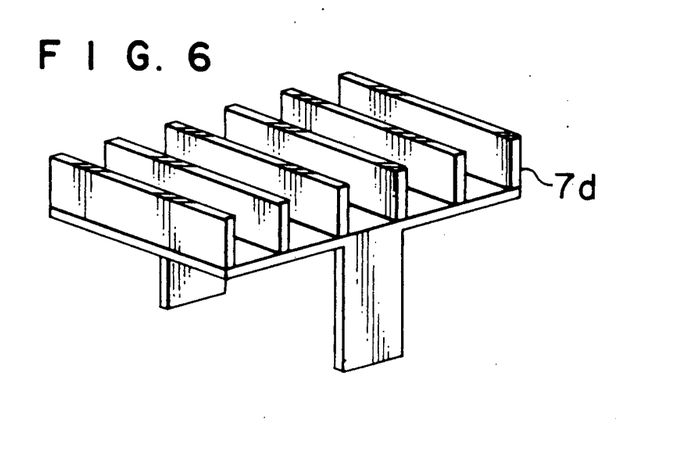
FIG. 6 is a perspective view of a heat transfer cap used in a fifth embodiment of the present invention.

The construction of the semiconductor package of FIG. 6 is substantially the same as that of the first embodiment; however, a cap 7d is provided. While the embodiment of FIG. 5 is suited for use in the case where cooling air is blown from the left lower side or right upper side as viewed in the figure, the embodiment of FIG. 6 is suited to the case where the cooling air is blown from the right inner side or left upper side. The heat transfer caps 7a to 7d are provided with legs which can be held in contact with the heat transfer leads 3 in the same manner as that described before in connection with the first embodiment or by one of suitable methods which will be described later.

Figure 7:
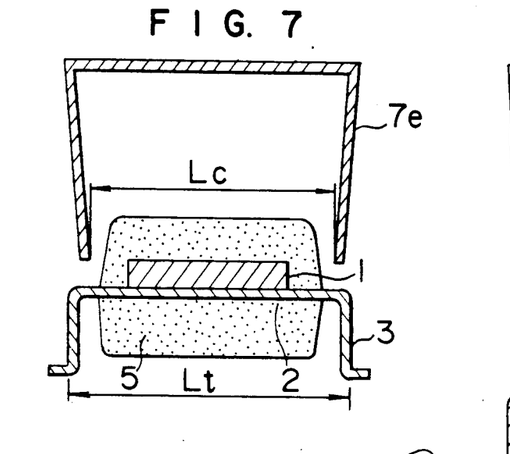
FIG. 7 is a sectional view of a sixth embodiment of the heat transfer cap of the present invention in a state before the fitting of a heat transfer cap.

FIG. 7 is a sectional view of a sixth embodiment of the semiconductor device of the present invention, in a state before mounting a heat transfer cap 7e. In FIG. 7, the distance Lc between the lower ends of both legs of the heat transfer cap 7e is smaller than the outside dimension Lt of the heat transfer leads 3 so that the legs of the heat transfer cap can press-fit on the heat transfer leads 3 so as to clamp the heat transfer leads 3 therebetween by a resilient force. It is thus possible to easily and detachably mount the heat transfer cap thereby facilitating replacement of the heat transfer cap.

Figure 8:
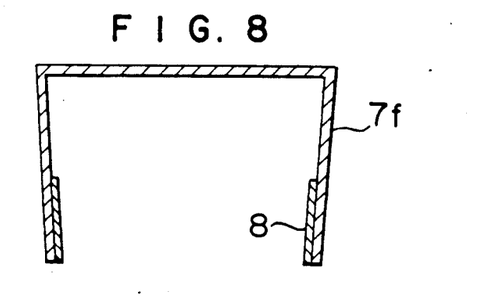
FIG. 8 is a sectional view of a heat transfer cap used in a seventh embodiment of the heat transfer cap of the present invention.

The cap 7f of FIG. 8 is similar to the cap used in the embodiment of FIG. 7, except that a solder layer 8 is interposed between each leg of the heat transfer cap and the associated heat transfer lead. After temporarily retaining the heat transfer cap 7f on the heat transfer leads through the intermediary of the solder layer 8 by the resiliency of the legs of the heat transfer cap 7f, the package is soldered to the printed circuit board so that the solder layer 8 also is fused whereby the heat transfer cap is soldered to the heat transfer leads simultaneously with the soldering of the semiconductor package to the printed circuit board.

Figure 9:
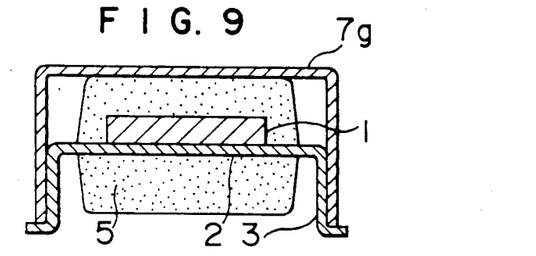
FIG. 9 is a sectional view of an eighth embodiment of the semiconductor device of the present invention.

In FIG. 9, the portion of a heat transfer cap 7g covering the package is bonded to the top surface of the package. With this arrangement, a portion of the heat generated by the semiconductor chip 1 is transmitted to the heat transfer cap also through plastic 5 of the package covering the semiconductor chip 1, whereby the heat transfer effect is enhanced. Needless to say, major portion of the heat is transmitted through the heat transfer leads 3 and the legs of the heat transfer cap 7g. The heat transfer cap 7g of this embodiment is not provided with fins.

Figure 10:
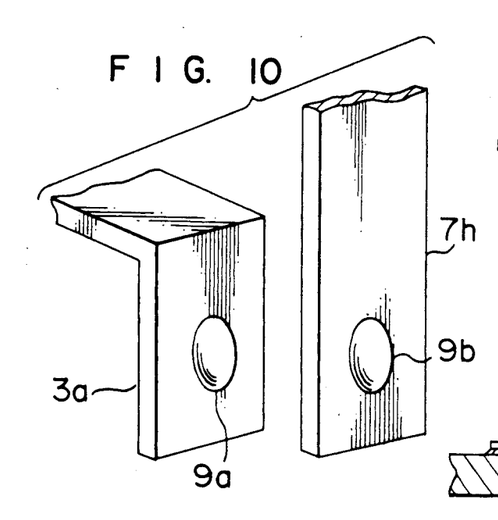
FIG. 10 is an enlarged perspective view of a ninth embodiment of the invention, showing particularly a heat transfer lead and a heat transfer cap.

FIG. 10 illustrates the manner in which heat transfer leads 3a are connected to legs 7h of a heat transfer cap 7 used in a ninth embodiment of the present invention.

The semiconductor package of FIG. 10 is materially the same as that of the first embodiment, and the heat transfer cap 7h is not provided with any heat transfer fin. Each heat transfer lead 3a is provided with a recess 9a for receiving a mating projection 9b formed on the surface of the associated leg 7h of the heat transfer cap. In the assembly of the semiconductor device, the legs of the heat transfer cap can be correctly located with respect to the associated heat transfer leads by virtue of the presence of the mating recess and projection.

Figure 11:
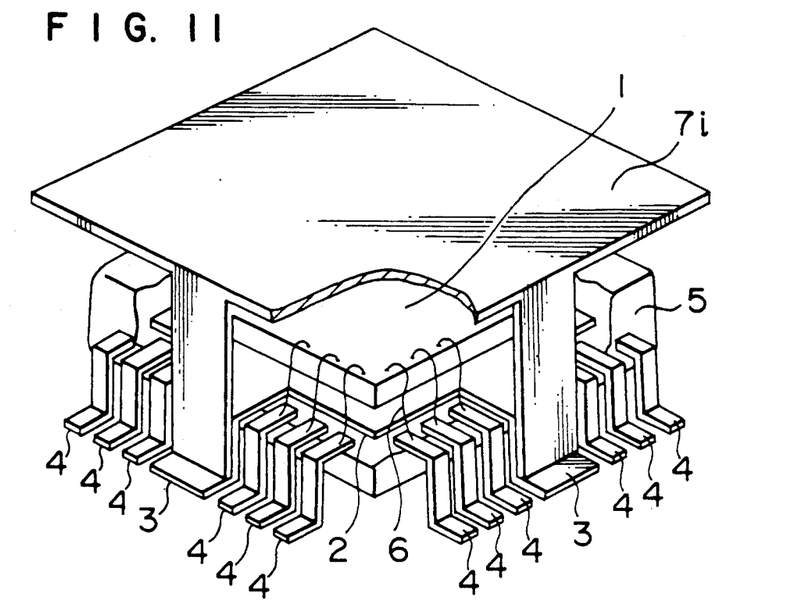
FIG. 11 is a perspective view of a tenth embodiment of the semiconductor device of the present invention.

In the embodiment of FIG. 11, heat transfer leads 3 extend from all of four sides of the package which is in this case assumed to be rectangular or square and are connected to four legs of a heat transfer cap 7i. This arrangement offers a more uniform cooling of the semiconductor chip 1.

Figure 12:
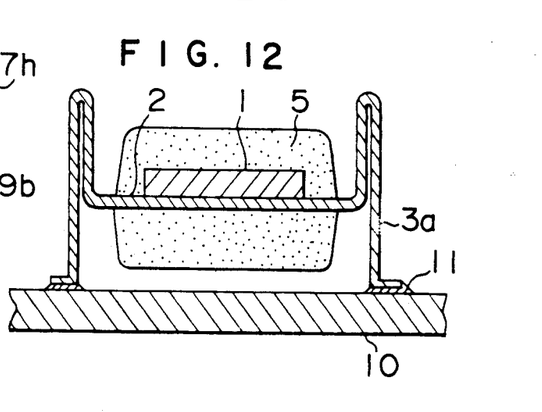
FIG. 12 is a sectional view of an eleventh embodiment of the semiconductor device of the present invention.

In the embodiment of FIG. 12, the heat transfer leads are first extended upward to a level above the top surface of the package and then folded back to extend downward into connection with the printed circuit board 10 by soldering 11. The portions of the heat transfer leads projecting above the package top surface effectively serve a heat transfer.

Figure 13:
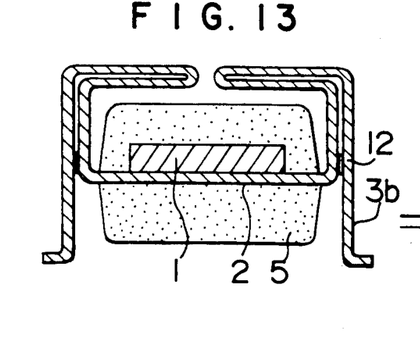
FIG. 13 is a sectional view of a twelfth embodiment of the semiconductor device of the present invention.

In the embodiment of FIG. 13, the heat transfer leads 3b are formed to cover the top surface of the package, offering the same heat transfer effect as that produced by the first embodiment. In the embodiment of FIG. 13, the portion of the heat transfer lead 3 led out of the package is jointed or bonded to the portion of the heat transfer lead 3 which extends downward from the upper bend of the lead 3 into connection with the printed circuit board, so that the heat transmitted from the chip pad 2 to the heat transfer leads 3 is effectively dissipated both to the air above the top surface of the package and the printed circuit board.

In FIG. 13, a numeral 12 denotes the region where the portion of the heat transfer lead 3 led out of the package is bonded to the portion of the same extending downward into connection with the printed circuit board.

Figure 14:
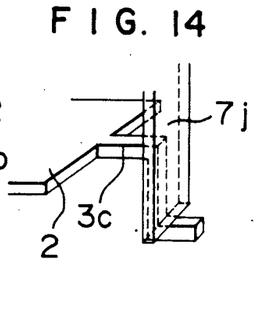
FIG. 14 is fragmentary enlarged perspective view of a thirteenth embodiment of the semiconductor device of the present invention, with a plastic portion being removed therefrom.

In the embodiment of FIG. 14, a chip pad suspension lead 3c is used as the chip pad extension which serves as the heat transfer lead. The chip pad suspension lead 3c functions as the heat transfer member through the width thereof is smaller than that of the leg 7j of the heat transfer cap.

Figure 15:
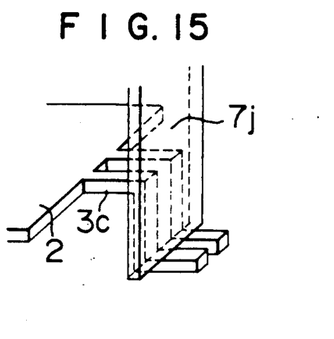
FIG. 15 is a fragmentary enlarged perspective view of a fourteenth embodiment of the semiconductor device of the present invention, with a plastic portion being removed therefrom.

In the embodiment of FIG. 15, one group consisting of a plurality of chip pad suspension leads 3c are jointed to each of the leg 7j of the heat transfer cap with surface contact.

Figure 16:
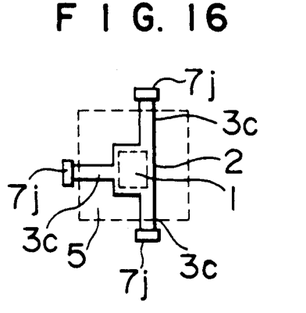
FIG. 16 is a sectional plan view of a fifteenth embodiment of the semiconductor device of the present invention.
Figure 17:
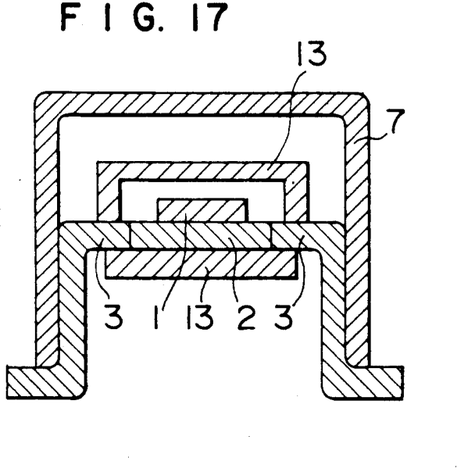
FIG. 17 is a sectional view of a sixteenth embodiment of the semiconductor device of the present invention.

It is possible, as shown in FIG. 16 to extend the chip pad suspension leads in a plurality of directions, e.g., in three directions, so as to connect the same to corresponding legs 7j of the heat transfer cap. In this case, however, it is preferred that the distances between the semiconductor chip and the connections between the heat transfer leads 3c and the legs 7j of the heat transfer cap are materially equal, in order to ensure that an uniform cooling effect is obtained over the entire portion of the semiconductor chip 1. The semiconductor device of FIG. 17 is of a ceramics-packaged type. Namely, lower and upper part of a ceramic case 13 seals therebetween the major parts of the semiconductor device including the semiconductor chip, chip pad 2, portions of the extensions 3 of the chip pad 2, portions of conductor leads (inner leads) and wires (not shown). The lower ceramics casing part is jointed to the underside of the chip pad 2 by, for example, metallizing, while the upper ceramics case part is arranged such as to leave a gap around the semiconductor chip 1. Other portions are materially the same as those of the first embodiment.

Figure 18:
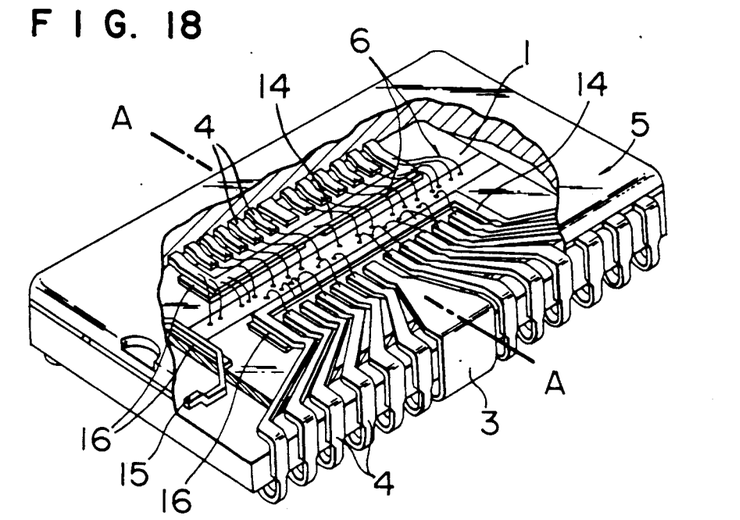
FIG. 18 is a perspective view of a seventeenth embodiment of the semiconductor device of the present invention.
Figure 19:
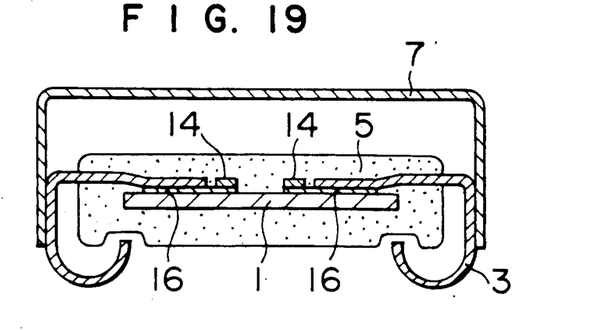
FIG. 19 is a sectional view taken along the line A—A of FIG. 18.

The embodiment of FIG. 18 is devoid of the chip pad used in the preceding embodiments. Thus, conductor leads 4 and the heat transfer leads 3 are bonded to the semiconductor chip 1 through the intermediary of an insulating film 16, and the conductor leads 4 and the electrodes of the semiconductor chip 1 are electrically connected through wires 16. These major components are then sealed with plastic 5. This type of package will be referred to as "lead-on-chip package", because the leads are arranged on the upper side of the semiconductor chip 1. Although FIG. 18 shows a common electrode lead 14 and suspension leads 15 which are used at the time of manufacture, these leads 14 and 15 may be omitted. The heat transfer leads 3 are directly connected to the semiconductor chip 1 through the thin insulating film 16. In addition, these leads are not intended for electrical connection. These leads 3, therefore, offer a heat transfer effect substantially equivalent to that produced by the heat transfer leads led from the chip pad in the preceding embodiments. In the embodiment of FIG. 19, a heat transfer cap 7 is connected to the heat transfer leads 3 of a lead-on-chip package. This heat transfer cap 7 reduces the heat resistance of the lead-on-chip package for the same reason as that in the first embodiment. Since the lead-on-chip package has the outer dimensions and configuration which are the same as those of ordinary semiconductor packages, the dimensions and the shape of the heat transfer cap 7, as well as the method of connection to the heat transfer leads 3, may the same as those explained before in connection with preceding embodiments. Although a lead-on-chip type package having leads arranged on the upper side of the chip 1 has been described, it will be clear that this embodiment can be applied substantially equally to other types of semiconductor packages, e.g., packages having leads arranged below the semiconductor chip 1 or on and below the semiconductor chip 1.

As has been described, the present invention can be carried out in various forms. For instance, the heat transfer cap of FIG. 5 is preferably used in the case where the semiconductor chip produce heat at a large rate while a considerably large spacing of the printed circuit boards is allowed. Conversely, where only a small spacing of the printed circuit boards is given while the rate of heat generation is small, the heat transfer cap of FIG. 9 can conveniently be used. Therefore, a package of a given size and configuration can be used for packaging different semiconductor chips having a wide variety of rates of heat generation.

It is also to be pointed out that the metallic caps used in the embodiments of FIGS. 1-11 serve also as protectors which protect the semiconductor packages from being damaged by any matter which may accidentally drop onto the packages.

Figure 20:
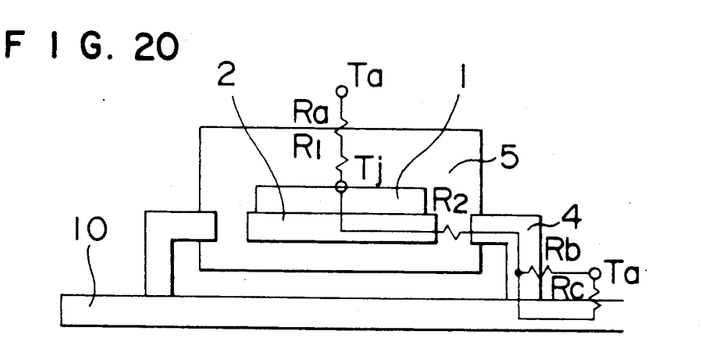
FIG. 20 is a sectional view of a known semiconductor device, illustrative of the path of heat transfer.

FIG. 20 illustrates the major path of heat transfer in an ordinary plastic IC package. This IC package has a semiconductor chip 1, a chip pad 2 on which the semiconductor chip is mounted and conductor leads 4 for inputting and outputting electrical signals. This IC is sealed by a plastic 5 and is mounted on a printed circuit board 10. The heat generated at the semiconductor chip 1 (junction temperature being represented by Tj) is dissipated to the ambient air (temperature Ta) from the upper portion of the package through the plastic (thermal resistance $R_1$) on the upper side of the chip 1. The boundary thermal resistance at the boundary between the package and the ambient air is represented by Ra. Heat is dissipated also through the chip pad 2, plastic 5 and the leads 4 to the ambient air. Heat is also conducted from the leads 4 to the printed circuit board 10 so as to be dissipated therefrom to the ambient air. In general, a metal exhibits a thermal conductivity which is as small as 1/100 to 1/1000 of that of plastic. Thus, the total heat transfer is significantly ruled by the thermal resistance $R_2$ of the plastic and boundary thermal resistances Rb and Rc. In ordinary ICs, major portion of the heat generated by the semiconductor chip is dissipated through the plastic portion which poses a considerably large thermal resistance and, therefore, the junction temperature rises to an excessively high level when the semiconductor chip produces large amount of heat, with the result that the semiconductor chip fails to operate.

Figure 21:
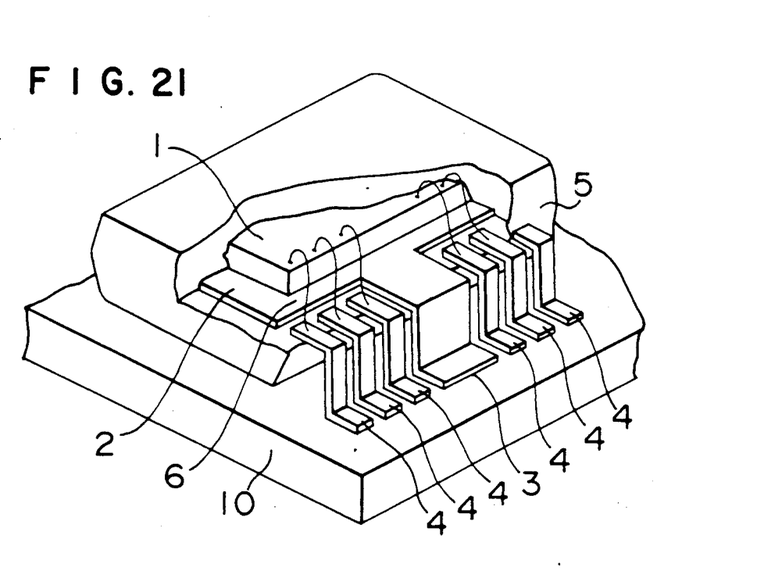
FIG. 21 is a perspective view of another known semiconductor device.

FIG. 21 is a perspective view of a plastic IC package of the type disclosed in Japanese Patent Unexamined Publication No. 61-53752, with a portion of the plastic removed to show the internal structure of the package. A semiconductor chip 1 is carried by a chip pad 2 which has extensions 3 serving as heat transfer leads and connected to a printed circuit board 10. Critical portions including the heat transfer leads 3 are shown in section in FIG. 22. FIG. 23 illustrates the path of heat transfer in the known IC package shown in FIGS. 21 and 22.

Figure 22:
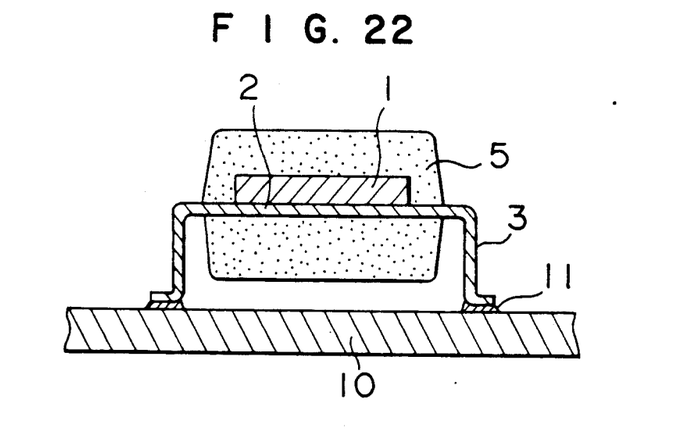
FIG. 22 is a sectional view of the central portion of the semiconductor device of FIG. 21.
Figure 23:
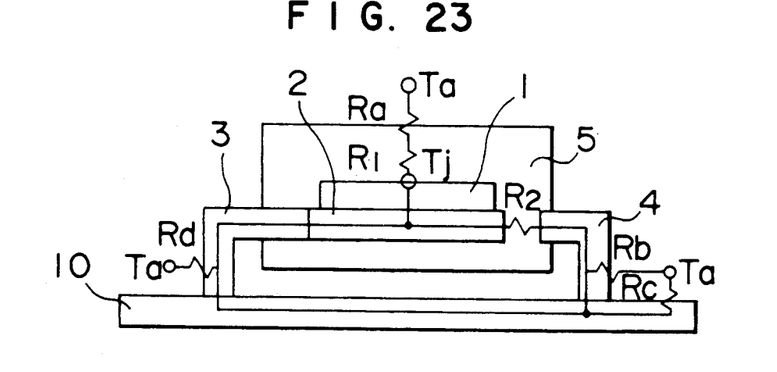
FIG. 23 is a sectional view of a semiconductor device of FIG. 21, illustrative of the path of heat transfer.

In addition to the paths of heat transfer shown in FIG. 20, the IC package shown in FIGS. 21 and 22 has a heat transfer path: namely, a path for allowing heat to be conducted from the chip pad 2 to the heat transfer leads 3, the heat being then dissipated to the ambient air and also to the printed circuit board connected to the heat transfer leads 3. Thus, the IC package shown in FIGS. 21 and 22 has a heat transfer path which does not include any plastic or similar material, so that it has a small thermal resistance as compared with the IC package shown in FIG. 20. The IC package of this type, therefore, can have a semiconductor chip which has a considerably large heat generation rate. However, the boundary thermal resistance Ra at the boundary between the heat transfer leads 3 and the ambient air is large because the heat transfer lead has a small area. Thus, there is a practical limit in the heat generation rate allowed for the packaged semiconductor chip particularly when the boundary thermal resistance Rc between the printed circuit board and the ambient air is large.

Figure 24:
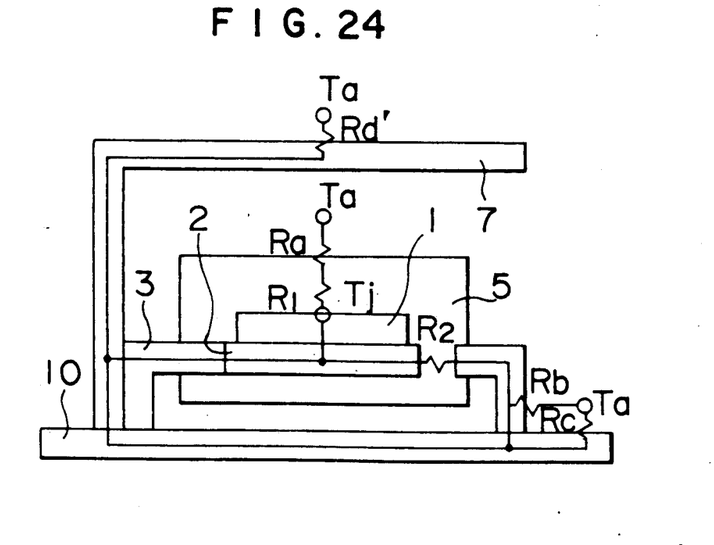
FIG. 24 is a sectional view of a general form of the semiconductor device of the present invention, illustrative of the path of heat transfer.

FIG. 24 illustrates major paths of heat conduction in a semiconductor package having a heat transfer cap as that used in the present invention. In this case, the heat transfer cap 7 is connected to the heat transfer leads 3. The heat transfer cap 7 can have a large heat transfer area as required, so that the boundary resistance $R_d$, between the cap and the ambient air can be reduced appreciably.

FIG. 24 is intended for illustrating the paths of heat transfer, so that the cap is illustrated to be connected only to one of the heat transfer leads. In order to fully achieve the object of the present invention, however, it is necessary that the cap is connected to both of at least one pair of heat transfer leads extended from opposing sides of the package, for otherwise only the portion of the semiconductor chip 1 adjacent to the side connected to the heat transfer cap is cooled while the other side is not cooled because the heat transfer lead has a considerably large thermal resistance due to a small thickness substantially the same as that of leads, e.g., 0.15 to 0.25 mm.

Figure 25:
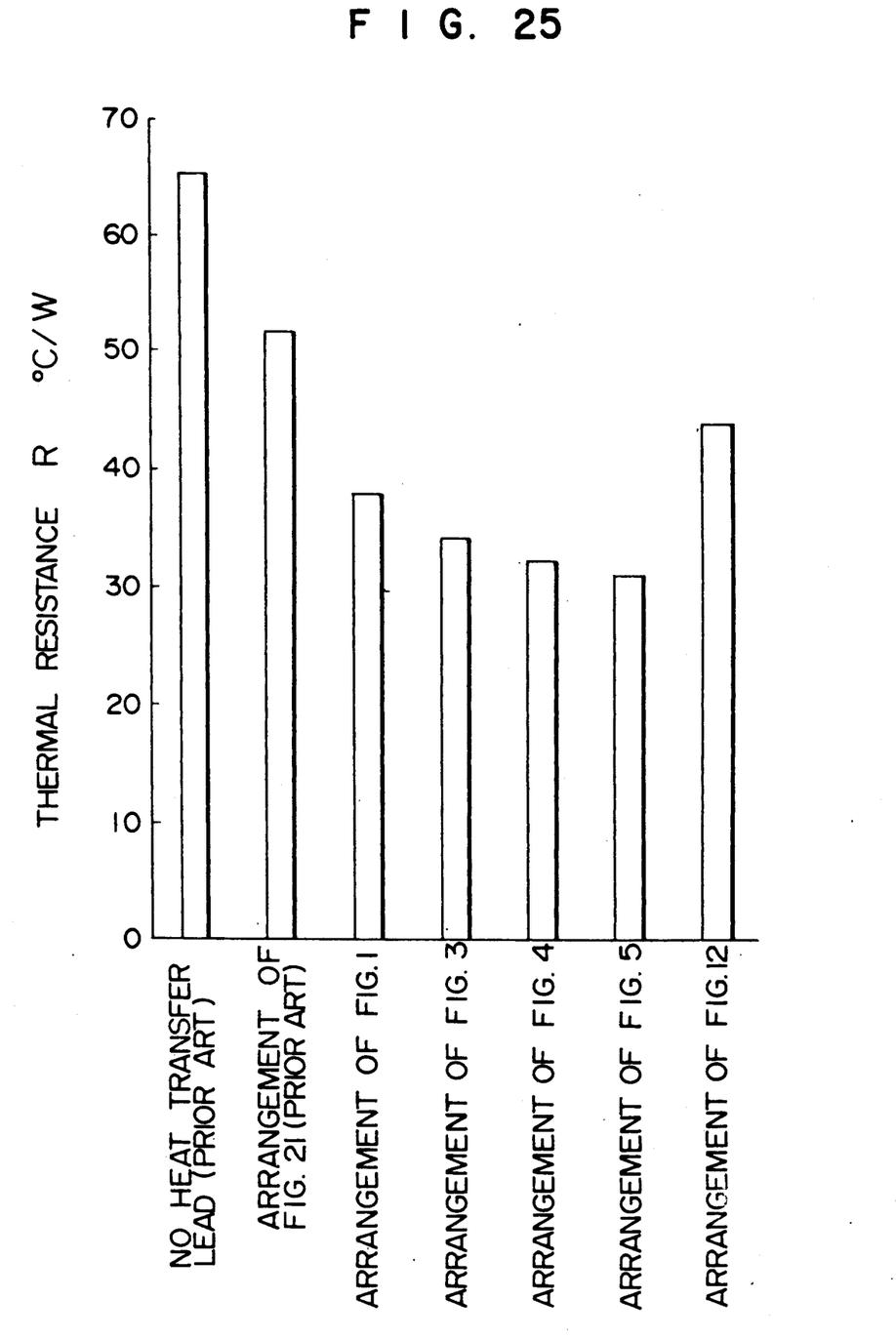
FIG. 25 is a characteristic chart showing the result of analysis of thermal resistance in the semiconductor device of the present invention in comparison with that of a conventional semiconductor device.

FIG. 25 shows the result of calculation of the thermal resistance in a semiconductor device in accordance with the present invention. It is assumed that the package has a square form with each side having a length of 20 mm, while the printed circuit board has a square form with each side having a length of 40 mm. From this Figure, it will be understood that the thermal resistance can be reduced almost to half that of the conventional semiconductor package.

Although the heat transfer effects have been discussed with reference to plastic semiconductor device, it is to be understood that the same discussion applies also to the case of ceramics-packaged semiconductor devices.

What is claimed is:
1. A semiconductor device comprising:
a semiconductor package including a semiconductor chip, a chip pad on which said semiconductor chip is mounted, leads, and a seal portion made of a plastic or ceramic so as to seal and package said semiconductor chip, said chip pad and said lead, said leads being lead from at least a pair of opposing sides of the sealed package, said chip pad having extensions extended for connection to the printed circuit board from both of at least a pair of opposing sides of said sealed package from which the leads are lead; and
a metallic cap held in contact with both of said extensions of said chip pad and shaped to cover at least a portion of a surface of said sealed package opposite to a surface facing said printed circuit board, and wherein said cap and said extensions of said chip pad are provided with mating projections and recesses for locating them with respect to each other.

2. A semiconductor device according to claim 1, wherein said recesses are formed on a surface of said cap making surface contact with said extensions of said chip pad, and said mating projections are formed at positions corresponding to said recesses on a surface of said extensions of said chip pad.

3. A semiconductor device according to claim 1, wherein said mating projections are formed on the surface of said cap making surface contact with said extensions of said chip pad, and said recesses are formed at positions corresponding to said mating projections on a surface of said extensions of said chip pad.

4. A semiconductor device according to claim 1, wherein said cap is connected to said extensions of said chip pad by soldering.

* * * * *